(12) United States Patent
Lange et al.

(10) Patent No.: US 7,741,704 B2
(45) Date of Patent: Jun. 22, 2010

(54) LEADFRAME AND MOLD COMPOUND INTERLOCK IN PACKAGED SEMICONDUCTOR DEVICE

(75) Inventors: Bernhard Lange, Fresiling (DE); Steven Kummerl, Carrollton, TX (US)

(73) Assignees: Texas Instruments Incorporated, Dallas, TX (US); Texas Instruments Deutschland GmbH, Freising (DE)

( * ) Notice: Subject to any disclaimer, the term of this patent is extended or adjusted under 35 U.S.C. 154(b) by 40 days.

(21) Appl. No.: 11/874,760

(22) Filed: Oct. 18, 2007

(65) Prior Publication Data

US 2008/0093715 A1    Apr. 24, 2008

Related U.S. Application Data

(60) Provisional application No. 60/882,472, filed on Dec. 28, 2006.

(30) Foreign Application Priority Data

Oct. 18, 2006    (DE) .................. 10 2006 049 235

(51) Int. Cl.
*H01L 23/495*    (2006.01)
*H01L 21/56*    (2006.01)
(52) U.S. Cl. .................................... 257/667
(58) Field of Classification Search ......... 257/666–677, 257/E23.004, E23.043–E23.05, E23.031–E23.059; 438/111, 123
See application file for complete search history.

(56) References Cited

U.S. PATENT DOCUMENTS

| | | | |
|---|---|---|---|
| 6,400,004 B1 * | 6/2002 | Fan et al. | 257/666 |
| 6,424,024 B1 | 7/2002 | Shih et al. | |
| 6,483,178 B1 | 11/2002 | Chuang | |
| 7,411,280 B2 * | 8/2008 | Yazid et al. | 257/676 |
| 2003/0015780 A1 * | 1/2003 | Kang et al. | 257/684 |
| 2003/0141577 A1 | 7/2003 | Hung et al. | |
| 2003/0189222 A1 | 10/2003 | Itou et al. | |
| 2004/0207054 A1 * | 10/2004 | Brown et al. | 257/676 |
| 2008/0079127 A1 * | 4/2008 | Gerber | 257/676 |

FOREIGN PATENT DOCUMENTS

WO    2005017968    2/2005

* cited by examiner

*Primary Examiner*—Dao H Nguyen
*Assistant Examiner*—Tram H Nguyen
(74) *Attorney, Agent, or Firm*—John J. Patti; Wade J. Brady, III; Frederick J. Telecky, Jr.

(57) ABSTRACT

An interference interlock between leadframe features and a mold compound is provided in a packaged semiconductor device by exposing at least one predetermined surface area to an etching process prior to a molding step. This produces an etched recess with a recessed wall delimited by a step wall, generally perpendicular and adjacent to the recessed wall. The step wall is partially undercut by etching. During the molding step, the recessed wall and the step wall are both contacted by and embedded in the molding compound.

5 Claims, 4 Drawing Sheets

LEADFRAME AND MOLD COMPOUND INTERLOCK IN PACKAGED SEMICONDUCTOR DEVICE

This application claims priority from German Patent Application No. DE 10 2006 049235.8 filed 18 Oct. 2006 and from U.S. Provisional Patent Application No. 60/882,472 filed 28 Dec. 2006, the entireties of both of which are incorporated herein by reference.

BACKGROUND

The invention relates to providing improved interconnection between a leadframe and mold compound in a packaged semiconductor device; and, in particular, to providing an improved mechanical interference interlock to improve delamination performance in a quad flat non-leaded package (QFN) mold or other packaged semiconductor device.

FIGS. 1 and 2 are partial section views of a conventional packaged semiconductor device with a die pad 10 and a leadframe pad 11 adjacent to and spaced apart from the die pad 10. The drawings are shown on an enlarged scale, the size of the packaged semiconductor device being typically on the order of a few tens of millimeters. The leadframe pad 11 and the die pad 10 are encapsulated in a mold compound 12. A die (semiconductor chip) 13 is provided on the die pad 10 and is attached to the leadframe pad 11 by a bond wire 14. The leadframe has opposing side walls 15 and 16, a top surface 18 and a bottom surface 19 opposing the top surface 18. The top surface 18 and the bottom surface 19 are generally perpendicular to the opposing side walls 15 and 16. The bottom surface 19 of the leadframe pad 11 can be soldered to a board and is provided with a recess 17, which can also extend back from one of the side walls 16 that is nearest to the die pad. The recess 17 is formed by etching the leadframe pad 11 and is then filled with mold compound when the whole semiconductor package is encapsulated by the mold. The leadframe pad 11 is formed of a number of "fingers," as seen in FIG. 2 which shows a side view of the packaged semiconductor device, looking at the side wall 15 furthest away from the die pad 10 on the outer edge of the device.

Many semiconductor devices may be manufactured in the same molded package and are then separated by a cutting step, which takes place after the die pad 10 and leadframe pad 11 have been encapsulated in the mold compound. In each package, the leadframe pads 11 of several adjacent devices may be formed as one common leadframe such that the devices are joined during formation. The common leadframe has an axis of symmetry between and parallel to the side walls 16, which will later form the side walls 15 of separate devices when cut.

FIG. 3 is a sectional side view illustrating the cutting step to separate two adjacent devices in the same package so as to arrive at the device shown in FIGS. 1 and 2. A saw blade 40 cuts along the axis of symmetry of the leadframe pad 11, perpendicular to an axis 41 which is parallel to the upper surface 18 of the leadframe pad 11. Two separate chips or dies are thus created.

Leadframes in packaged semiconductor devices that are pre-plated using NiPdAu or other finishes, however, have low adhesion to the mold compound in which the leadframe is encapsulated. This means that when individual chips or dies are separated by cutting, or are subject to temperature excursions, the leadframes can come loose from the encapsulating mold. This leads to separation from the bond wires, which risks that the device will not work and will be wasted. The invention has been devised with the foregoing in mind.

SUMMARY

The invention provides an improved interference interlock between leadframe features and a mold compound is provided in a packaged semiconductor device.

In described embodiments, prior to a molding step, at least one predetermined surface area of the leadframe is exposed to an etching process that produces an etched recess. The etched recess is produced with a recessed wall, which is delimited by a step wall. The step wall is generally perpendicular and adjacent to the recessed wall and is partially undercut by the etching process. Both the recessed wall and the step wall are contacted by and embedded in the molding compound during the molding step. This means that there is an improved mechanical grip between the leadframe and the mold compound in which it is encapsulated and they are bonded together more securely. Thus bond wire breakage on the leadpad (leadfinger) and wastage are less likely.

The leadframe has opposed top and bottom surfaces and preferably predetermined surface areas are exposed simultaneously to an etching process both on the top surface and on the bottom surface. The etched recess can be formed either in the top surface of the leadframe adjacent to a bond pad and/or in the bottom surface of the leadframe adjacent to a base surface adapted to be soldered on a board.

Multiple similar semiconductor devices can be simultaneously packaged on a common leadframe. These multiple packaged semiconductor devices can then be individualized by cutting through the cured molding compound and common leadframe along predetermined separation lines. At least one of the separation lines may extend through one etched recess in the leadframe. Alternatively, one of the separation lines can extend between two adjacent etched recesses in the leadframe.

The leadframe can be provided with a set of parallel spaced leadframe fingers for each semiconductor device. The leadframe fingers can then have similar etched recesses aligned with each other.

BRIEF DESCRIPTION OF DRAWINGS

Further advantages and features of the invention will become apparent from the following description of example embodiments taken together with the accompanying drawings, wherein.

DETAILED DESCRIPTION OF EXAMPLE EMBODIMENTS

Figure 1:
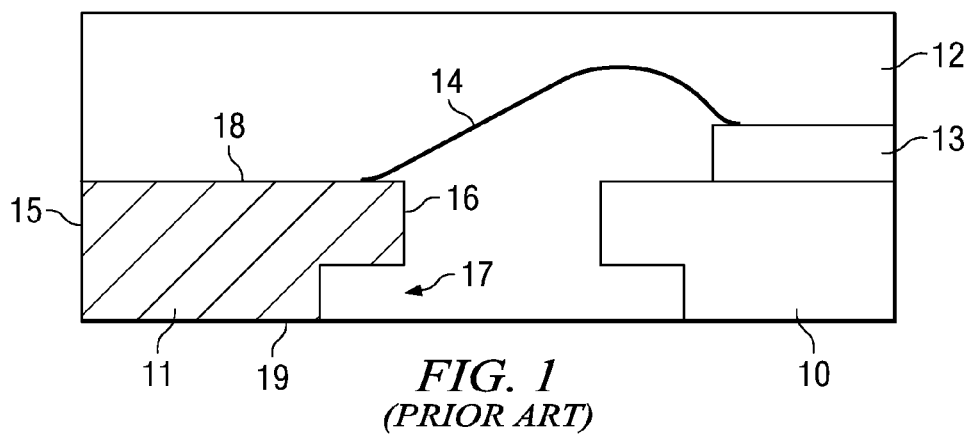
FIG. 1 (Prior Art) is a schematic diagram of a side view section of a prior art packaged semiconductor device.
Figure 2:
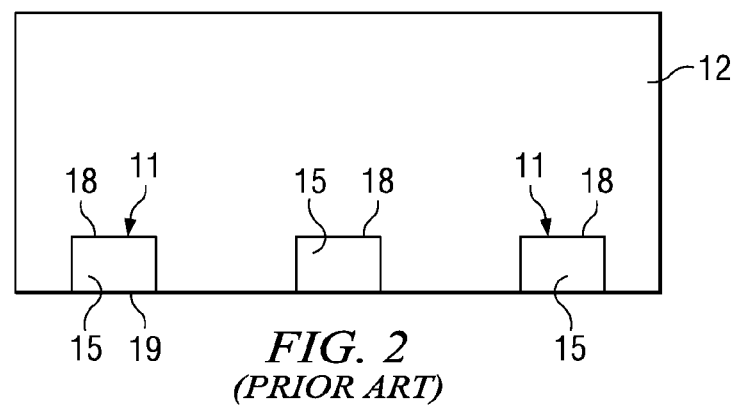
FIG. 2 (Prior Art) is a schematic diagram of lead formation of the prior art packaged semiconductor device.
Figure 3:
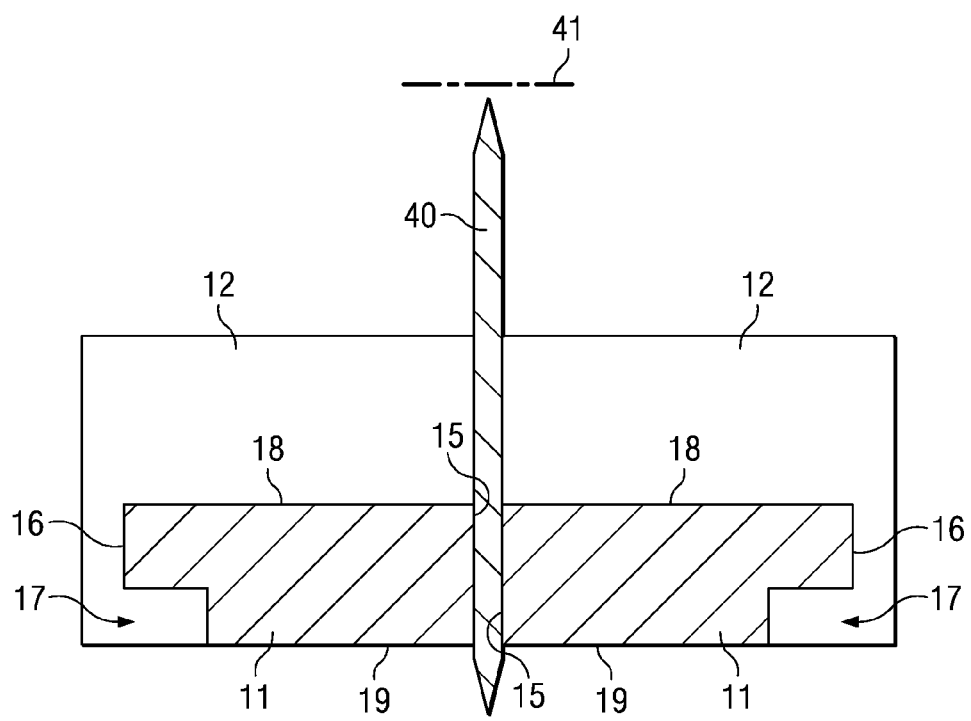
FIG. 3 (Prior Art) is a schematic sectional diagram illustrating a cutting process for prior art packaged semiconductor devices.
Figure 4:
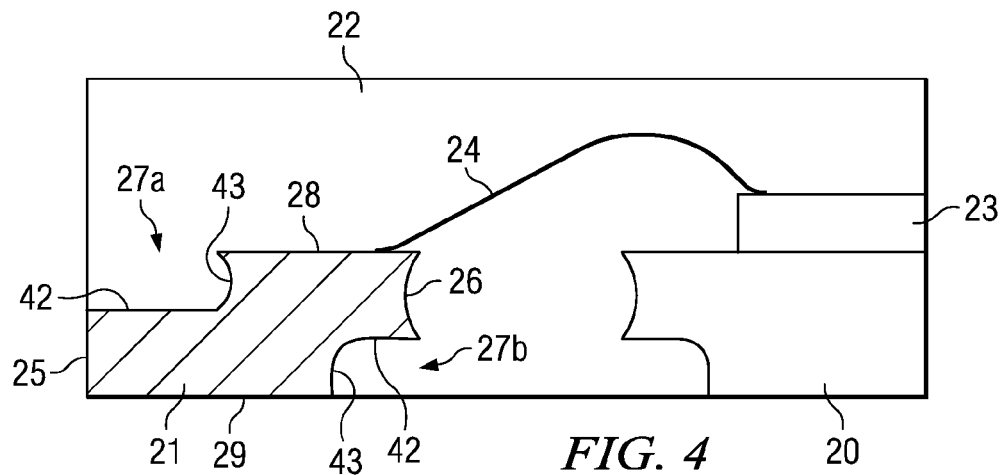
FIG. 4 is a schematic diagram of a side view section of a packaged semiconductor device formed according to a first embodiment of the invention.
Figure 5:
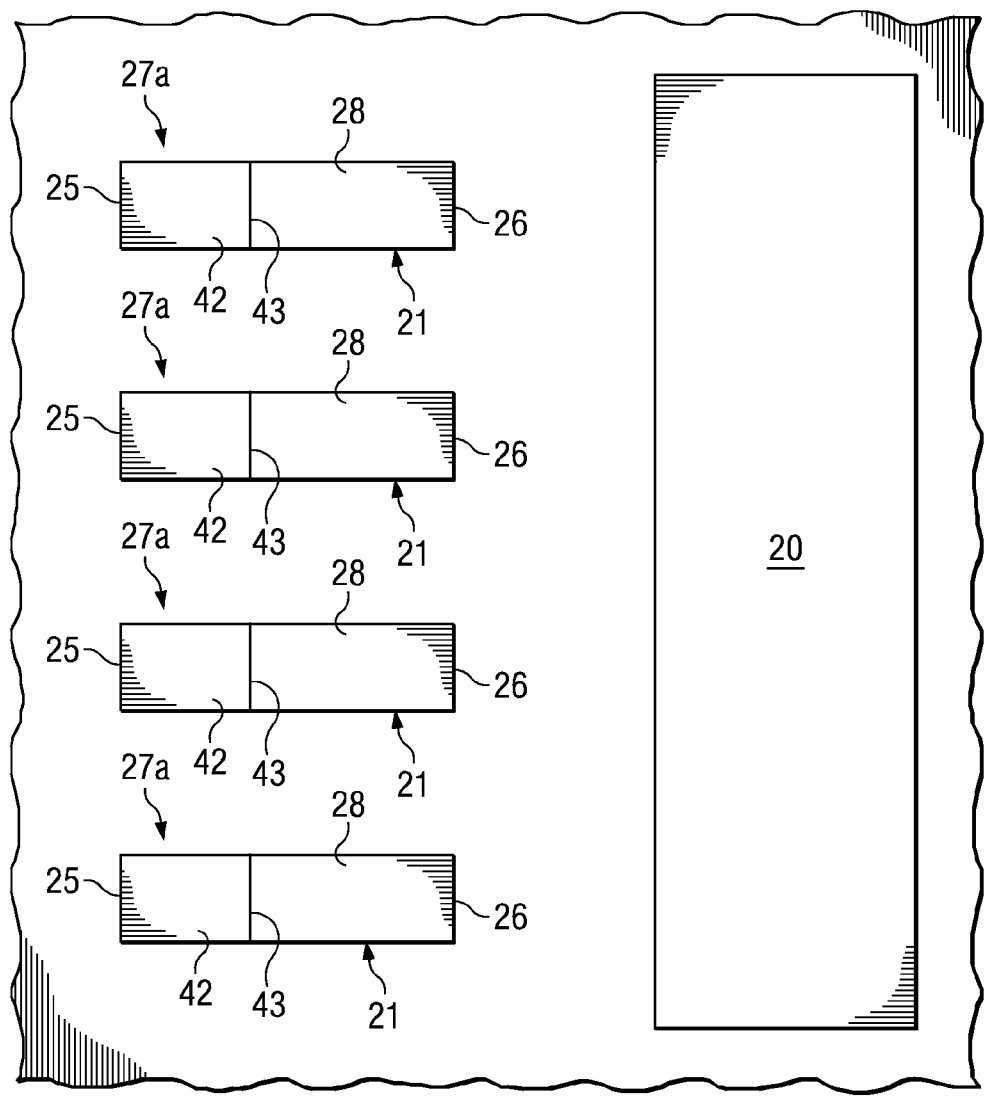
FIG. 5 is a schematic top view of the packaged semiconductor device of FIG. 4.
Figure 6:
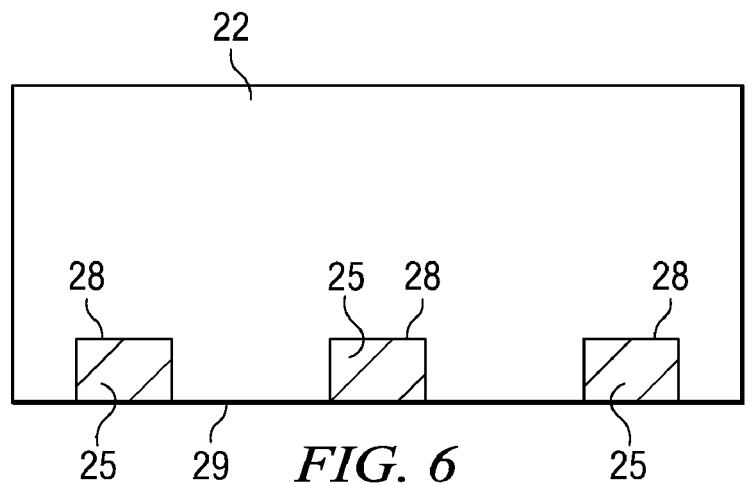
FIG. 6 is a schematic sectional view of lead formation in the packaged semiconductor device of FIG. 4.

Referring now to FIGS. 4 to 6, a packaged semiconductor device comprises a die pad 20 and a leadframe pad 21 arranged adjacent to and spaced from the die pad 20. The leadframe pad 21 has a top surface 28 and a bottom surface 29 opposing the top surface 28. The leadframe pad 21 is provided with opposing side walls 25 and 26, which are generally perpendicular to the top and bottom surfaces 28 and 29. The side wall 25 is an outer wall of the leadframe pad 21 and delimits one pad of an individual semiconductor device. The side wall 26 faces the die pad 20. A semiconductor die or chip 23 is provided on the top surface of the die pad 20 and is attached to the leadframe pad 21 by a bond wire 24, which is connected to the top surface 28 of the leadframe pad 21. The bottom surface 29 of the leadframe pad 21 and the bottom surface of the die pad 20 are both adapted to be soldered to a board (not shown). The device, apart from the bottom surface 29 and the side wall 25 of the leadframe pad 21, and the bottom surface of the die pad 20 is encapsulated by a mold 22.

A recess 27a is provided in the top surface 28 of the leadframe pad 21 so that the side wall 25 is substantially half the total thickness of the leadframe pad 21. Another recess 27b is provided in the bottom surface 29 of the leadframe pad 21 so that the side wall 26 is also substantially half the total thickness of the leadframe pad 21 and does not join with the bottom surface 29 of the leadframe pad 21.

The recesses 27a and 27b each have recessed walls 42, which are substantially flat and parallel to the top and bottom surfaces 28 and 29, respectively. The recesses 27a and 27b each also have step walls 43, which are perpendicular to the recessed walls 42 and extend between the recessed walls 42 and the top and bottom surfaces 28 and 29, respectively. Each of the step walls 43 is undercut so that it forms a curved shape as it extends between the apex of the top wall 28 or the bottom wall 29 and the associated recessed wall 42; i.e., they are concave. The side wall 26 is also undercut so that it is concave from an apex with the top surface 28 to an apex with the recess wall 42 of the recess 27b. The bottom surface of the die pad 20 is also provided with a recess having a concave step wall, and a concave side wall adjacent to the recess.

To form the device shown in FIGS. 4 to 6, the top surface 28 and the bottom surface 29 of the leadframe pad 21 are simultaneously exposed to an etching process, which forms the recesses 27a and 27b. The parts of the top and bottom surfaces 28 and 29 which are not to be etched are masked. When the recessed walls 42 are at the required distance or depth from the top surface 28 and the bottom surface 29, respectively, the etching process is stopped. During the etching process, the step walls 43 are over-etched so that they are partially undercut and concave. The side wall 26 is also exposed to etching so that it is undercut.

The die 23 is then attached to the top of the die pad 20 and a bond wire 24 is attached to the top surface of the die 23 and the top surface 28 of the leadframe pad 21 by a bonding process. Of course, several bond wires will be provided, as appropriate. Molding compound is then used to encapsulate the die pad 20, leadframe pad 21, die 23 and bond wires 24, apart from the side wall 25, the bottom surface 29 of the leadframe pad 21 and the bottom surface of the die pad 20, so that the molding compound fills the recesses 27a and 27b and is also received in the concave step walls 43. The molding compound is then cured so that the leadframe pad 21 is embedded in the mold compound 22. Because the molding compound is received in the step walls 43, there is mechanical interference (interlocking) between the leadframe pad 21 and the mold 22.

Figure 7:
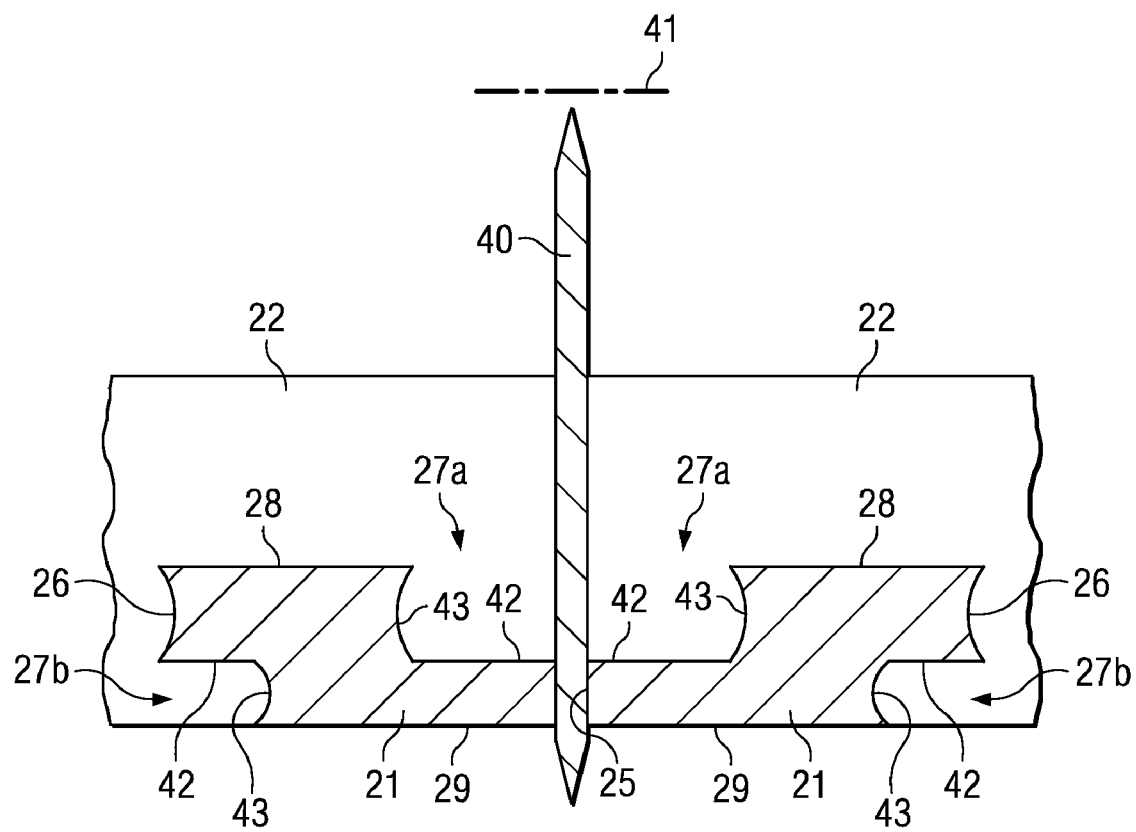
FIG. 7 is a schematic diagram illustrating a cutting process for a packaged semiconductor device as in FIGS. 4-6.

Several similar such semiconductor devices may be simultaneously packaged on a common leadframe. The individual devices are then separated by a cutting process, which is illustrated in FIG. 7. The leadframe shown in FIG. 7 serves as a common leadframe for two semiconductor devices that have not yet been separated. A saw blade 40 is arranged perpendicular to a horizontal axis 41. The axis 41 is perpendicular to predetermined separation lines between individual devices. In the illustrated embodiment, the separation line extends through the center of a common recess (two adjoining recesses 27a) so that, when the devices are separated, the separation lines will form the side walls 25 of the individual leadframes 21.

The saw blade 40 then cuts through the cured molding compound and the common leadframe along the separation line in the center of the common recess. Two separated packaged semiconductor devices are thereby formed. The saw blade 40 only has to cut through half of the leadframe thickness because the height of the side wall 25 is only about half the total height of the leadframe in the common recess. Because the undercut concave step walls 43 receive the molding compound, an interlocking action is effected between the leadframe pad 21 and the mold 22. This interlocking feature prevents the leadframe pad 21 and the mold 22 from separating and keeps the bond wire 24 intact.

It can be seen from FIG. 6 that the height of the leadframe "fingers" on the side of the device package is approximately half that in a conventional device. However, having a decreased height on the package side does not impact soldering, since only the base surface needs to be soldered. Each of the leadframe fingers shown in FIG. 6 have similar etched recesses 27a and 27b aligned with each other.

Figure 8:
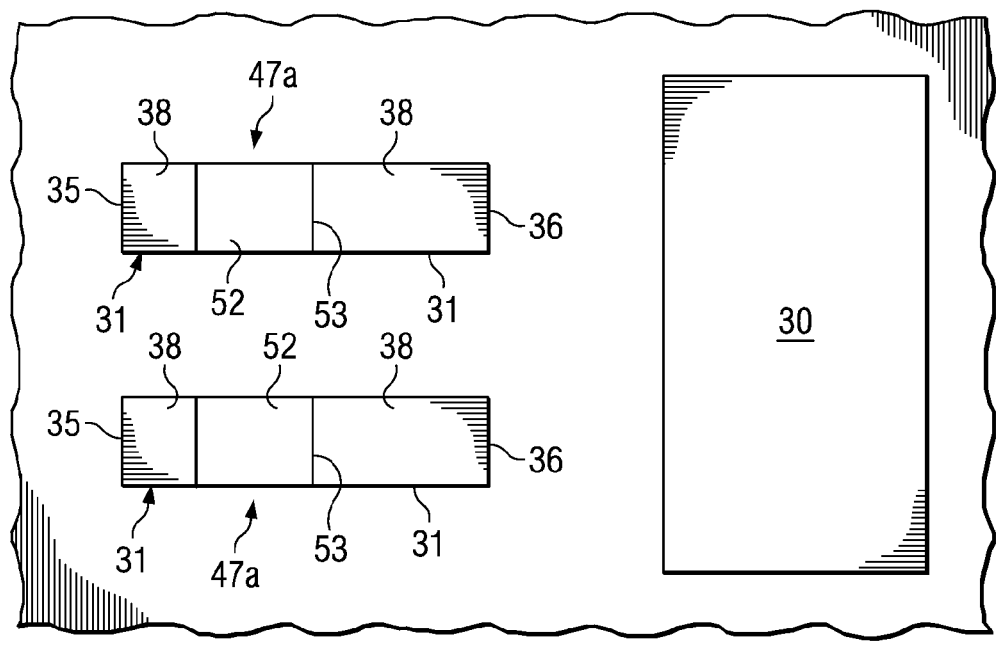
FIG. 8 is a schematic top view of a packaged semiconductor device formed according to a second embodiment of the invention.
Figure 9:
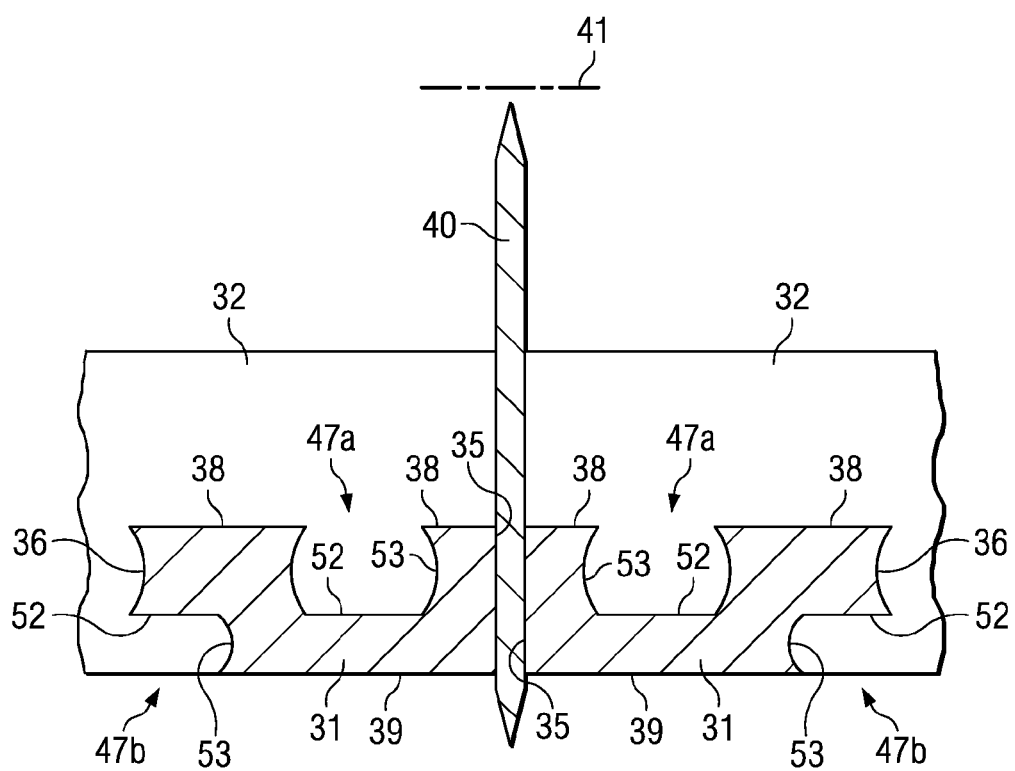
FIG. 9 is a schematic diagram illustrating a cutting process for a packaged semiconductor device as in FIG. 8.

FIGS. 8 and 9 show a second embodiment in which a semiconductor device package has a leadframe pad 31 with a top surface 38 and a bottom surface 39 opposing the top surface 38. The leadframe pad 31 also has opposing side walls 35 and 36 provided perpendicular to the top and bottom surfaces 38 and 39. The side wall 35 forms an outer wall of the leadframe pad 31, and may provide a solderable surface. The side wall 36 is adjacent to and spaced apart from the die pad (not shown here). A recess 47a is provided in the top surface 38. In this embodiment, however, the recess 47a is not provided in the side wall 35 but instead is provided generally in the center of the top surface 38. Thus, the height of the side wall 35 is not reduced by the presence of the recess 47a. As with the previous embodiment, a recess 47b is provided in the bottom surface 38 so that the height of the side wall 36 is reduced to approximately half the total height of the leadframe pad 31. The recesses 47a and 47b have recessed walls 52, which are generally parallel with, and recessed from, the top and bottom surfaces 38 and 39, and step walls 53, which are concave and extend between the top surface 38 or the bottom surface 39 and the recessed walls 52.

The recess 47b is formed in the bottom surface 39 in the same way as described for the device of the previous embodiment. However, to form the recess 47a in the top surface 38, the top surface 38 is masked at both ends so that the recess is formed in the top surface 38 between the side walls 35 and 36. The leadframe pad 31 is then exposed to an etching process and, during the etching process, each step wall 53 is undercut so that it is concave as it extends from an apex with the top surface 58 to the recessed wall 52. The etching process is stopped when the recessed wall 52 is at the required depth below the top surface 58. The leadframe pad 31 is then encapsulated in a molding compound, which is cured so that the leadframe pad 31 is embedded in a mold 32. The molding compound is received in the recesses 47a and 47b and fills the concave step walls 53 so that there is mechanical interference (interlocking) between the leadframe pad 31 and the mold 32.

As described above, multiple such semiconductor devices may be packaged on a common leadframe. The common leadframe is then cut so as to separate individual devices. As with the previous embodiment, a saw blade 40 arranged perpendicular to a horizontal axis 41 cuts though the cured molding compound 32 and common leadframe along predetermined separation lines. However, in this embodiment the separation lines extend between two adjacent etched recesses 47a in the leadframe and will form the side walls 35 of each individual leadframe pad 31. This means that the saw blade 40 cuts through the full thickness of the leadframe to separate the devices so that, when individual semiconductor devices are formed, the side wall 35 of each individual leadframe pad 31 has the same thickness as that in a conventional packaged device and may be used as a soldering surface. As with the previous embodiment, the undercut concave step walls in the recesses 47a and 47b provide a locking action between the leadframe pad 31 and the mold 32 so that the leadframe does not become loose and move outwardly of the device.

Although the invention has been described with reference to particular embodiments, it is not limited to these embodiments and no doubt further alternatives will occur to the skilled artisan that lie within the scope of the invention as claimed.

What is claimed is:

1. A method for providing an interference interlock between leadframe features and a molding compound in a packaged semiconductor device, the method comprising:

exposing at least one predetermined surface area of the leadframe to an etching process that produces an etched recess with a recessed wall that extends from a top wall toward a bottom wall, wherein the recessed wall being delimited by a step wall generally perpendicular and adjacent to the recessed wall, and wherein the step wall being at least partially undercut by etching to form a curve from the top wall to the recess wall that is substantially concave in shape; and in a subsequent molding step, contacting both the recessed wall and the step wall by and embedding the recessed wall and the step wall in the molding compound;

wherein multiple similar semiconductor devices are simultaneously packaged on a common leadframe, and the multiple packaged semiconductor devices are separated into individual devices by cutting through the cured molding compound and common leadframe along predetermined separation lines; wherein at least one of the separation lines extends through an etched recess in the leadframe.

2. The method according to claim 1, wherein the leadframe has opposed top and bottom surfaces, and predetermined surface areas are exposed simultaneously to an etching process both on the top surface and on the bottom surface.

3. The method according claim 1, wherein the leadframe has a set of parallel spaced leadframe fingers for each semiconductor device and the leadframe fingers have similar etched recesses aligned with each other.

4. The method of claim 1, wherein multiple similar semiconductor devices are simultaneously packaged on a common leadframe, and the multiple packaged semiconductor devices are separated into individual devices by cutting through the cured molding compound and common leadframe along predetermined separation lines; wherein at least one of the separation lines extends in a land area between two adjacent ones of etched recesses in the leadframe.

5. The method according claim 4, wherein the leadframe has a set of parallel spaced leadframe fingers for each semiconductor device and the leadframe fingers have similar etched recesses aligned with each other.

* * * * *